(12) United States Patent
Bracaleone

(10) Patent No.: US 6,794,578 B2
(45) Date of Patent: Sep. 21, 2004

(54) QUADRAX TO TWINAX CONVERSION APPARATUS AND METHOD

(75) Inventor: Salvatore Bracaleone, Canyon, CA (US)

(73) Assignee: Sabritec, Inc., Irvine, CA (US)

( * ) Notice: Subject to any disclaimer, the term of this patent is extended or adjusted under 35 U.S.C. 154(b) by 80 days.

(21) Appl. No.: 10/096,087

(22) Filed: Mar. 11, 2002

(65) Prior Publication Data

US 2002/0187681 A1 Dec. 12, 2002

Related U.S. Application Data

(60) Provisional application No. 60/276,263, filed on Mar. 14, 2001.

(51) Int. Cl.$^7$ .................................................. H01B 7/08
(52) U.S. Cl. .................................. 174/117 FF; 174/251
(58) Field of Search ....................... 174/117 FF, 117 F, 174/251; 333/1, 243, 236

(56) References Cited

U.S. PATENT DOCUMENTS

| 4,891,616 A | * | 1/1990 | Renken et al. ............... 333/236 |
| 5,003,273 A | * | 3/1991 | Oppenberg ..................... 333/1 |
| 5,242,318 A | | 9/1993 | Plass |
| 5,811,727 A | | 9/1998 | Lo |
| 6,290,532 B1 | * | 9/2001 | Vermeersch et al. ........ 439/460 |

* cited by examiner

Primary Examiner—Chau N. Nguyen
(74) Attorney, Agent, or Firm—Knobbe Martens Olson & Bear LLP

(57) ABSTRACT

A Quadrax to Twinax conversion apparatus includes stacked trace layers of transmission line with a ground plane between the trace layers. Embodiments include trace layers of stripline or microstrip. Orthogonal plated through holes include a diagonal pair of through holes in electrical contact with traces on one of the trace layers and another diagonal pair of through holes in electrical contact with another trace layer. Contact pins extend through these orthogonal plated through holes with one pair of pins making electrical contact with one trace layer and the other pair of pins making electrical contact with another trace layer. The conversion apparatus electrically connects Twinax cables to respectively different trace layers without crossing over or disturbing the relative positions of the Quadrax diagonal pairs for very efficient high-speed data transfer from four wire Quadrax to two wire Twinax cables.

3 Claims, 12 Drawing Sheets

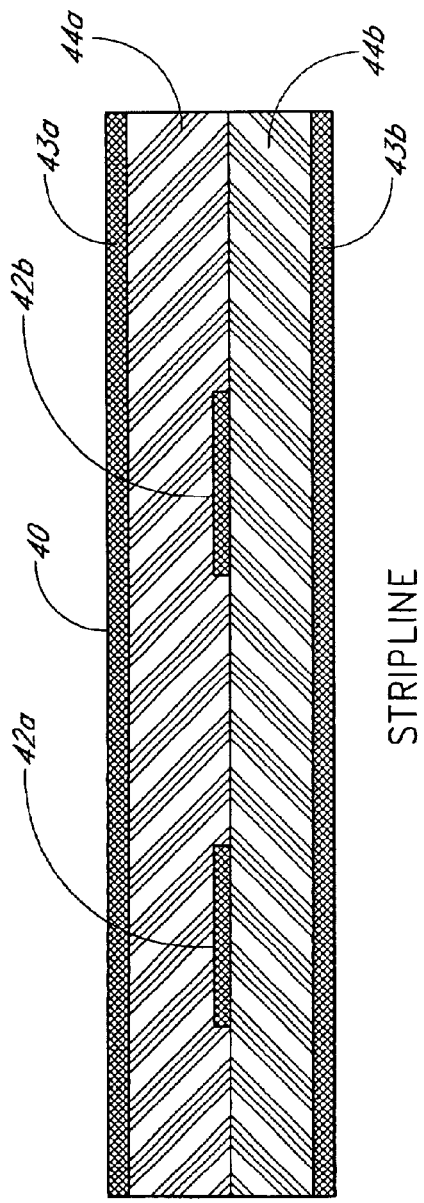
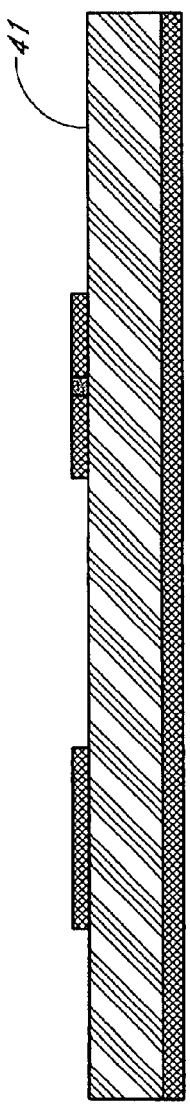
FIG. 3A STRIPLINE
FIG. 3B MICROSTRIP

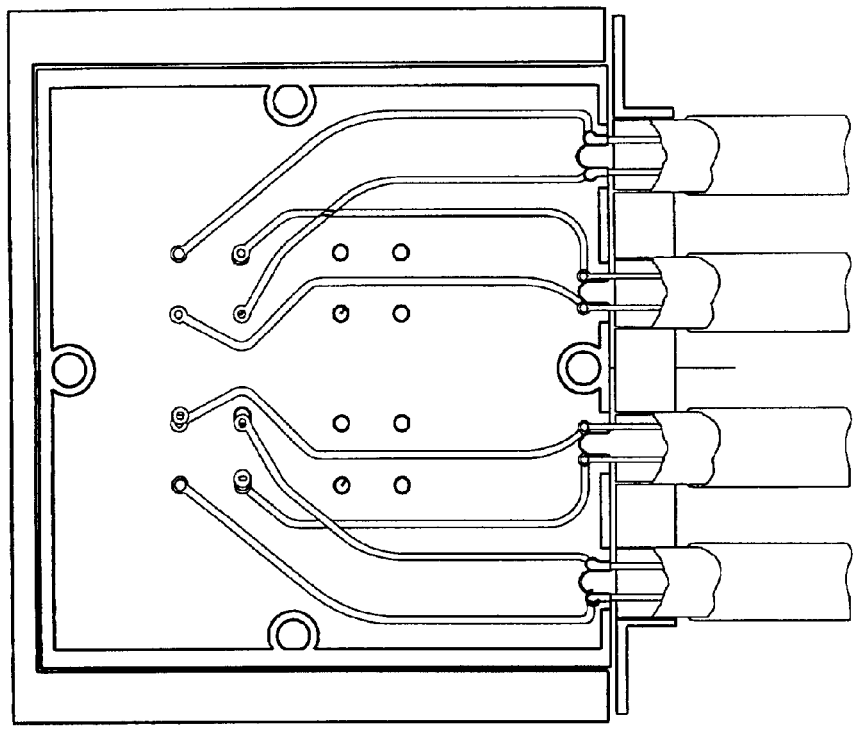
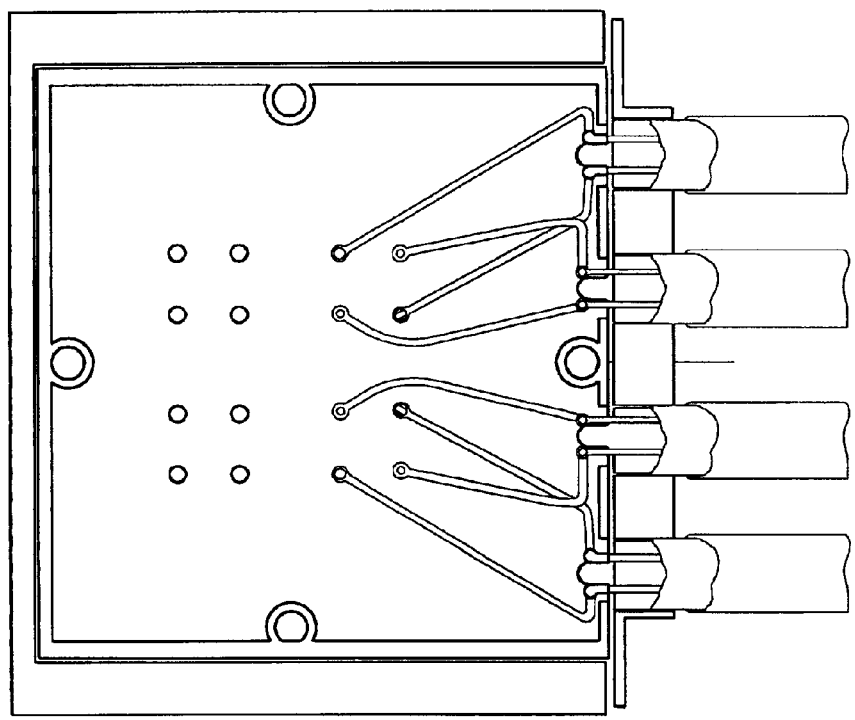
FIG. 7

QUADRAX TO TWINAX CONVERSION APPARATUS AND METHOD

This application claims the benefit of U.S. Provisional Application No. 60/276,263 filed Mar. 14, 2001 entitled "QUADRAX TO TWINAX CONVERSION APPARATUS AND METHOD", the entire contents of which is expressly incorporated by reference.

FIELD OF THE INVENTION

This invention relates to high-speed data transference and particularly to conversion from four wire (Quadrax) to two wire (Twinax).

SUMMARY OF THE INVENTION

High speed data transference requires transmission systems that minimize reflections. This is achieved through controlled characteristic impedance from source to load. In conventional microwave systems, this is accomplished with waveguide or coaxial transmission lines. However, with current high-speed data transfer, such as fiber channel, the source and load differential impedances are usually high and of the order of 100 to 150 ohms. Achieving these high impedances in coaxial transmission lines is size prohibitive. A more efficient transmission line for high-speed data transfer is Twinax wherein the signals are carried between a pair of conductors.

An even more efficient transmission line is four-channel Quadrax, wherein four wires are carried within a single enclosure. However, as described below, significant problems arise when the four channels must be physically separated.

The preferred embodiment of the present invention provides a solution to this problem and utilizes a novel combination of stacked stripline or microstrip and contact pins extending into the through-hole plated openings to locate a common ground plane between two trace layers to couple to two wire (Twinax) conductor without disturbing the relative positions of the diagonal pairs of the four wire (Quadrax) conductor.

BRIEF DESCRIPTION OF THE DRAWINGS

FIGS. 3(A) and 3(B) respectively illustrate, in cross-section and in substantial enlargement, the stripline and the microstrip transmission line configurations;

FIG. 7 illustrates the use of multiple layers of stripline board;

DETAILED DESCRIPTION OF THE PREFERRED EMBODIMENT

Currently, high-speed data transference requires transmission systems that minimize reflections. This is achieved through controlled characteristic impedance from source to load. In microwave systems, this is accomplished with waveguide or coaxial transmission lines. In both cases, the line geometry is the determining factor along with dielectric and conductor materials. Steps, bends, protrusions etc. will invariably cause reflections with consequent loss of transmission efficiency (insertion loss) and sending-end disturbance. In 2-wire differential-mode transmissions this is acceptable at lower data rates. When data rates become higher, such as fiber channel (into microwave frequencies), the line characteristic impedances become much more critical.

In fiber channel systems the source and load differential impedances are usually high (100–150Ω). Achieving these high impedances in a coaxial transmission line 20 (FIG. 1(A)) is size prohibitive. As a result, a line configuration such as Twinax 25 (FIG. 1(B)) wherein the signals are carried between a pair of conductors (usually round) critically spaced from each other and surrounded by a conductive enclosure. In this "differential line," high impedances are easily obtained since the mutual capacitance between the conductors is minimized.

Figure 1C:
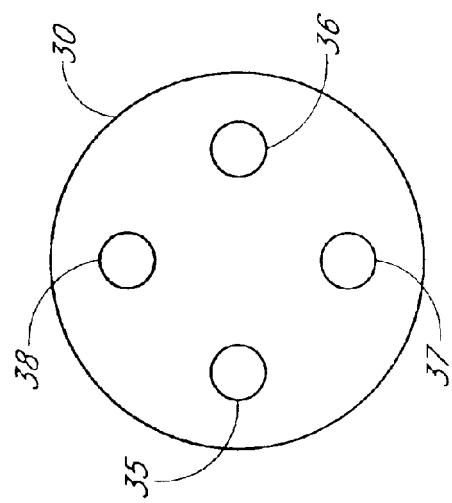
FIG. 1(C) illustrates a four conductor (Quadrax) transmission line in cross-section.
Figure 1B:
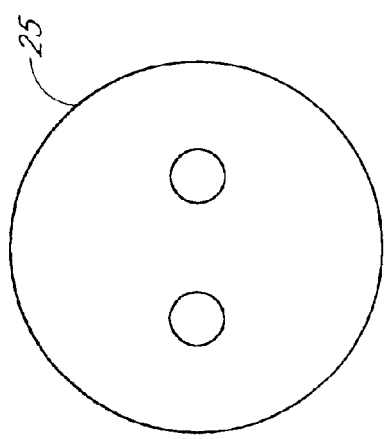
FIG. 1(B) illustrates a two conductor (Twinax) transmission line in cross-section.
Figure 1A:
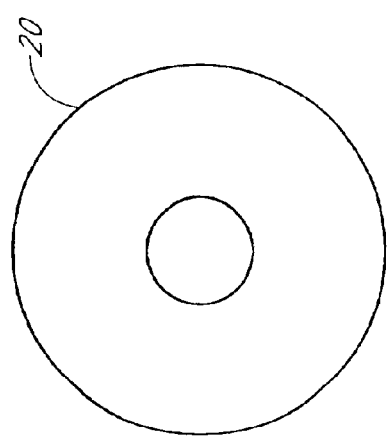
FIG. 1(A) illustrates a single conductor coaxial transmission line in cross-section.

A more efficient development for fiber channel transmission is called Quadrax 30 (FIG. 1(C)), having a single enclosure enclosing four wires 35, 36, 37, and 38. In Quadrax, a pair of conductors forms a Twinax differential pair. These respective pairs 35, 36 and 37, 38 must be diagonal because the paired conductor electric fields are mutually perpendicular and will therefore not couple. This condition eliminates cross talk, maintaining channel isolation.

Quadrax rather than Twinax is advantageously employed for longer line runs. However, a significant problem arises in the prior art when the two orthogonal channels of the Quadrax are physically separated into two separate pairs of Twinax. In the prior art, the pairs of the Quadrax 30 cross over when converted to Twinax resulting in impedance disturbance and reflections with some cross talk. At low frequencies or data rates, this is somewhat manageable, however, when data rates approach microwave frequencies, the resulting system degradation becomes unacceptable.

Figure 2:
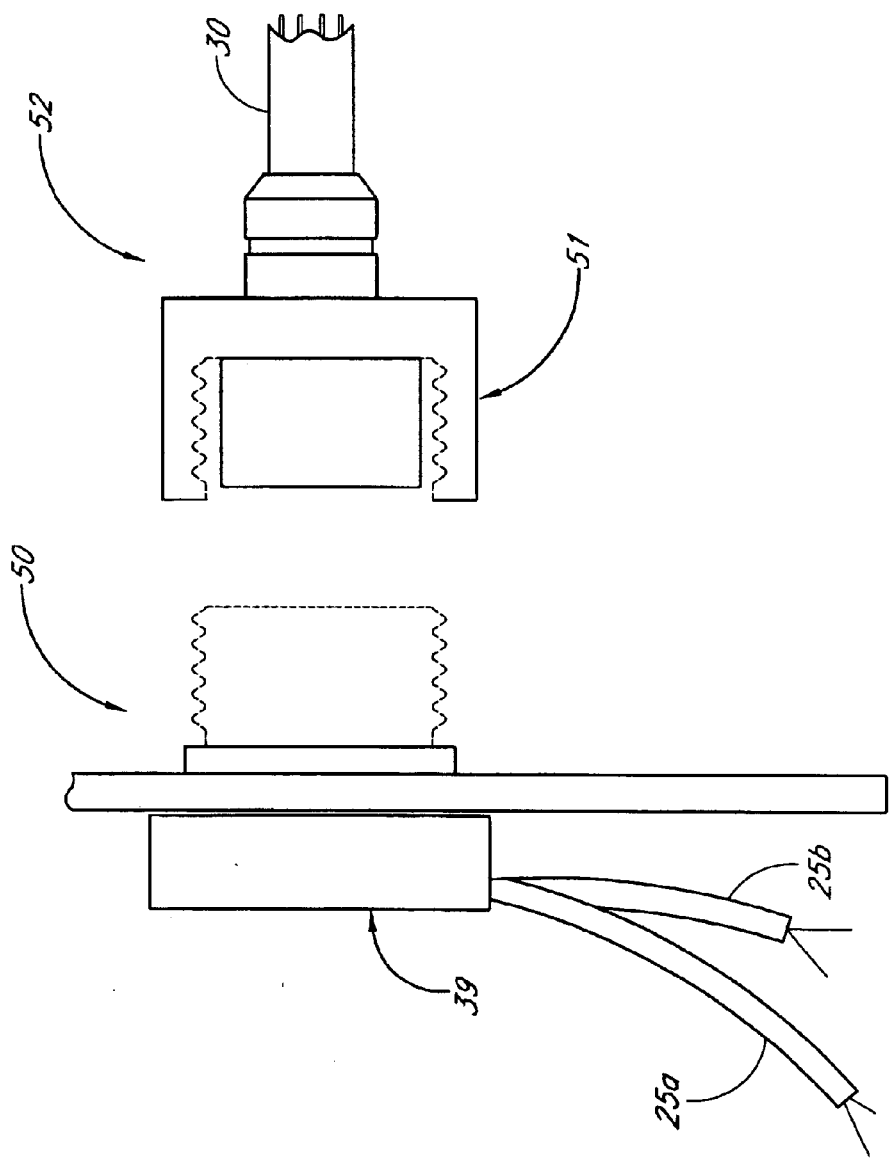
FIG. 2 illustrates, in partial cross-section, the external configuration of one embodiment of the invention.

The preferred embodiments of this invention utilize a novel combination of transmission line configuration(s) of stripline 40 or microstrip 41 (FIG. 3), to solve the problem of converting Quadrax to Twinax. Moreover, the embodiment described advantageously enables the conversion to be performed in a connector apparatus. As shown in FIG. 2, two Twinax conductors 25a and 25b are connected to one end 39 of a connector apparatus 50 and the Quadrax cable 30 is connected to the other end 51 of a mating connector apparatus 52. Either stripline or microstrip configurations maybe used, however, stripline will be described below.

Strip transmission line is a method of transmitting RF signals in a controlled impedance environment. The signal bearing line is a metal strip 42a, 42b between two ground planes 43a, 43d and separated by dielectric circuit boards 44a, 44b (see FIG. 3). The conductive metal strips 42a, 42b are typically formed on the dielectric boards 44 by selective removal by chemical etching of the metal to leave the residual strips 42.

The initial construction of one embodiment of the invention is best illustrated in FIGS. 4, 5, 6 and 8 in which a multi-level stack comprises locating a first trace layer on level 2 between groundplanes 1 and 3 and a second trace layer on level 4 between ground planes 3 and 5. The first traces 60, 61 on trace level 2 terminate at pad openings 65, 66 whereas a second set of traces 70, 71 on trace level 4 terminate at pad openings 75, 76. The two conductors of a first Twinax line 25a connect to respective ends of 80, 81 of traces 60, 61. The twin conductors of a second Twinax line 25b connect to respective ends 85, 86 of traces 70, 71. The differential pair of conductors are soldered, or otherwise affixed to the surface pads on levels 2 and 4 shown in FIGS. 5 and 6.

Figure 4:
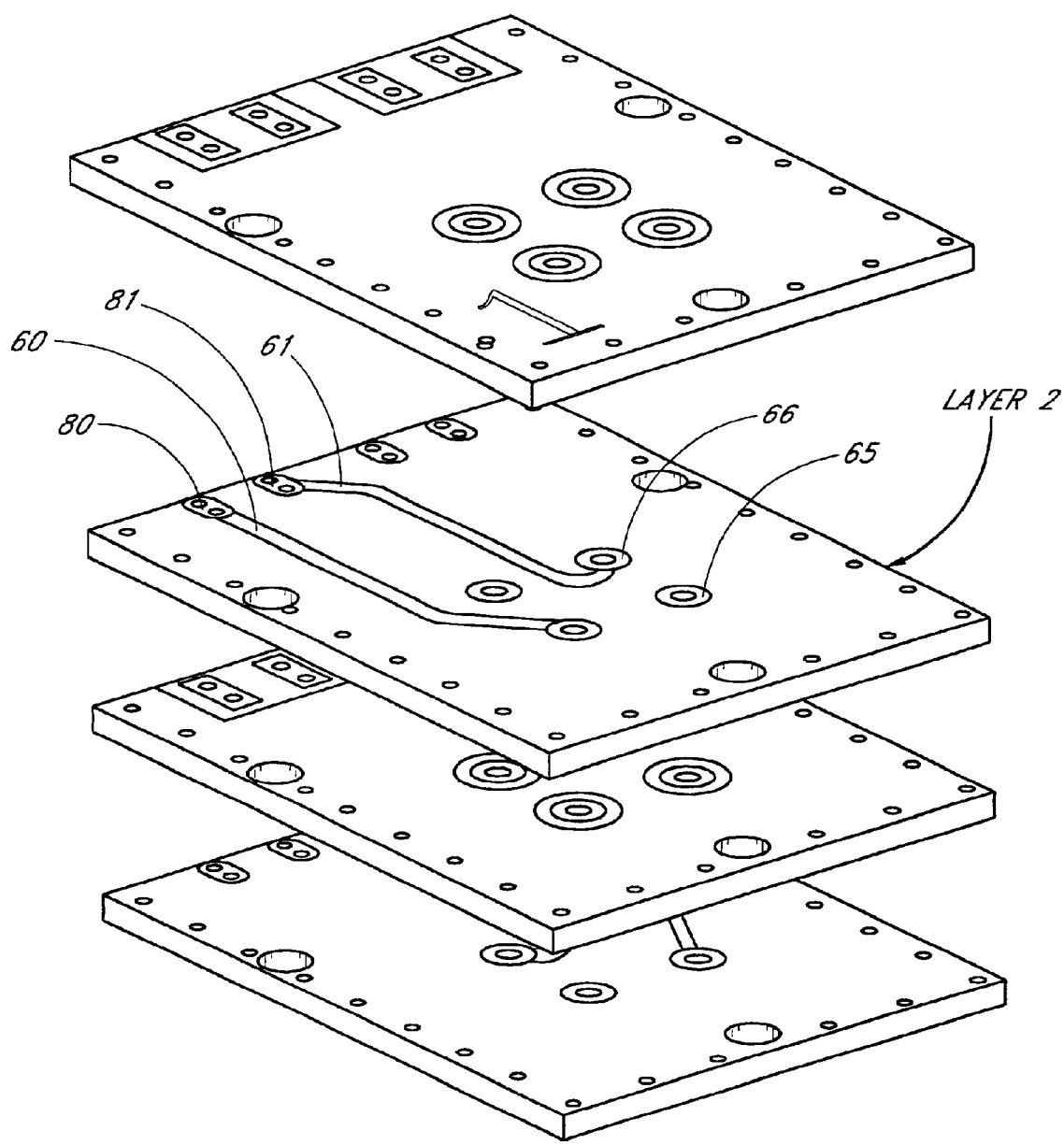
FIG. 4 is an enlarged perspective view of a four layer stripline used in the preferred embodiment of this invention.
Figure 5:
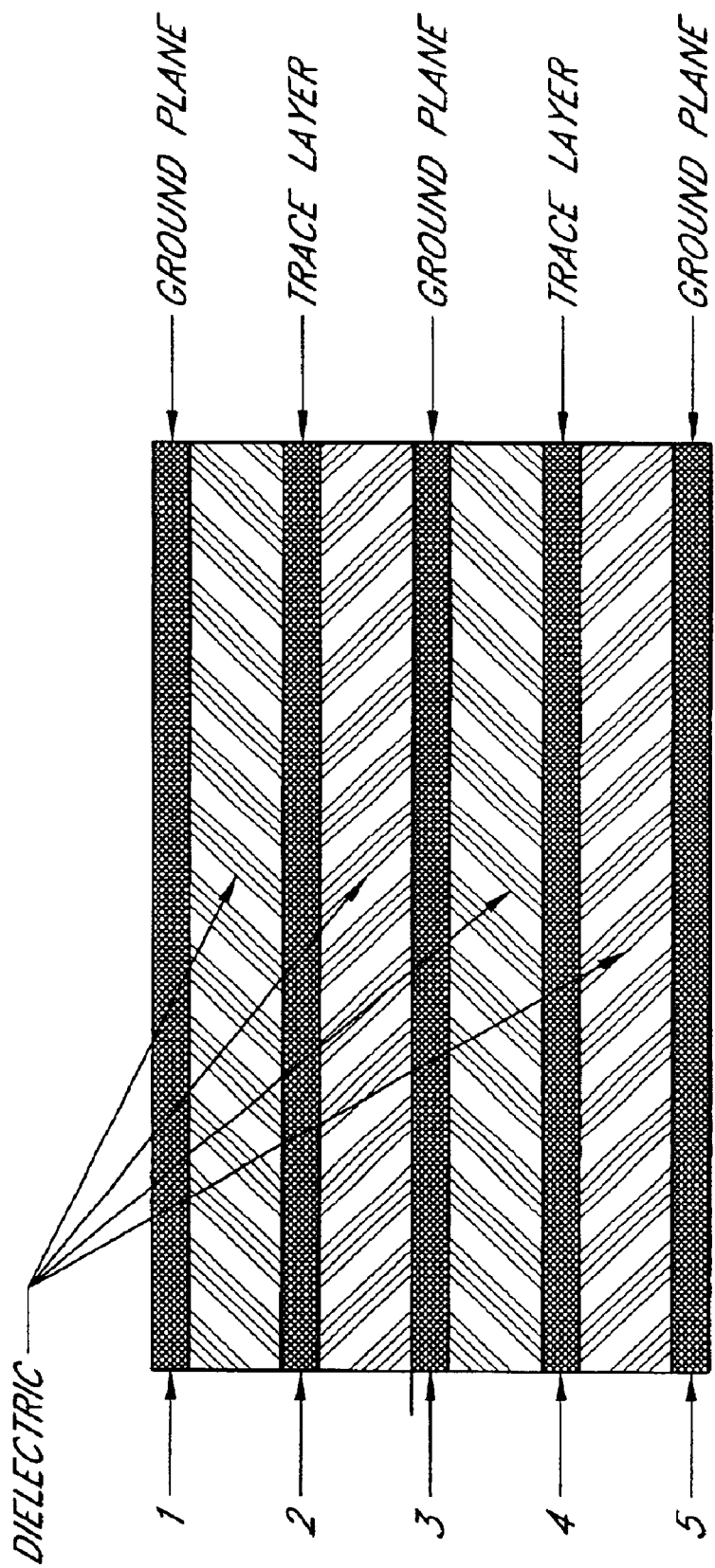
FIG. 5 is a horizontal elevational view of the stripline of FIG. 4.
Figure 8:
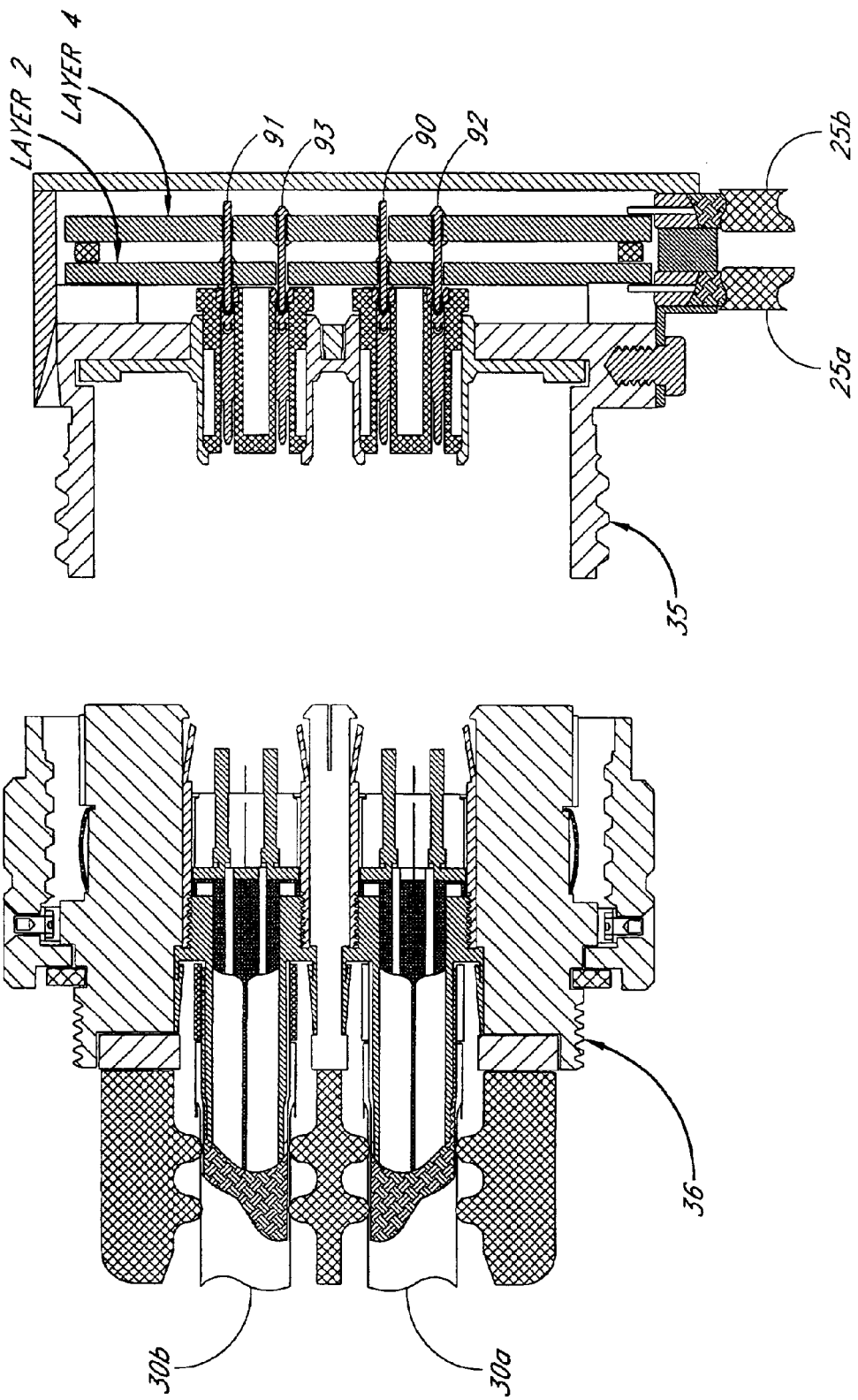
FIG. 8 illustrates a connector utilizing the multiple layers of FIG. 7.

The four conductors of the Quadrax cable 30 respectively electrically connect to one of the strips 60, 61, 70, 71 by contact pins 90, 91, 92, 93. These contact pins are best shown in FIG. 8, which illustrates in cross section a connector adapted to connect to a pair of side-by-side Quadrax cables 30a and 30b and in FIG. 12, which illustrates a connector adapted to connect to a single Quadrax cable. Contact pins 90, 91, 92, 93 couple straight onto the stripline traces without crossing over or disturbing the relative positions of the selected diagonal pairs. This is accomplished by a series of plated through holes through the multi-level stack and is best shown in FIGS. 4 and 5. The diagonal pairs from the Quadrax interface are attached to the pad openings on their assigned traces, while merely passing through the through-holes in the other board having the traces and pads belonging to the other diagonal pair. Thus, referring to FIGS. 8 and 12, one pair of pins 90, 91 are in electrical contact with through-hole pad openings, such as pads 65, 66 of layer 2 (shown in FIG. 6), but do not contact the traces on layer 4. As noted above, these through-hole openings 65, 66 are respectively in contact with traces 60, 61. The other pair of pins 92, 93 (best shown in FIG. 8) are in electrical contact with through-hole pad openings of layer 4 (examples being pads 75, 76 shown in FIG. 6), but merely pass through layer 2 without contacting the traces on this layer 2. This maintains the impedance relatively consistent and therefore not frequency sensitive.

Referring to FIGS. 2 and 8, when connector body 36 engages connector body 35, the pins 90, 91, 92, 93 of connector 35 are engaged by corresponding conductors in connector 36 which in turn are connected to the internal conductors of one or more Quadrax cables 30.

Figure 6:
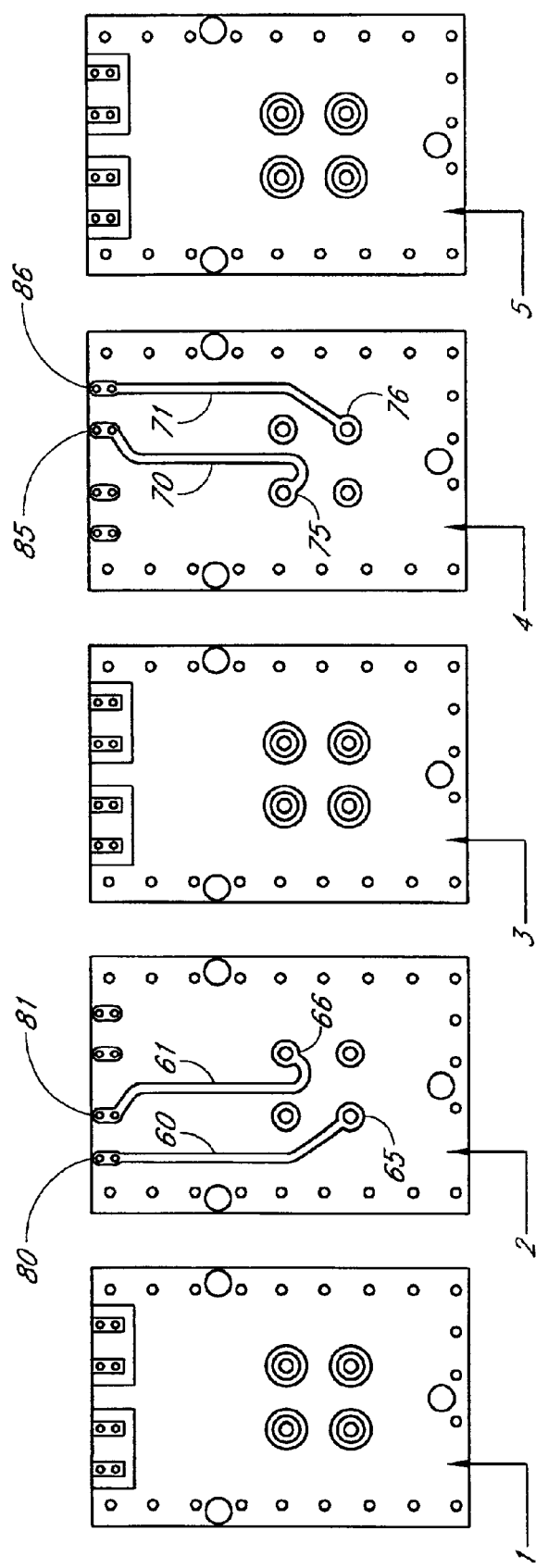
FIG. 6 illustrates a top plan view of the ground plane plans and trace layers of the stripline of FIG. 4.

Referring to FIGS. 4, 5 and 6, a common ground plane (3) is located between the two trace layers (2 and 4). As a result, the trace signal pairs 60, 61 and 70, 71 will be isolated with each signal pair in the controlled impedance of effectively two separate transmission systems. As described above and shown in FIGS. 6 and 8, these separated pairs ran to respective surface pads 80, 81 and 85, 86 and selected through plated-through holes connect to the assigned embedded traces.

The configuration described and shown in FIGS. 4, 5, and 6 can be duplicated on a multiplicity of regions on a single multi-layered stripline board or several boards (as shown in FIG. 7).

Figure 9:
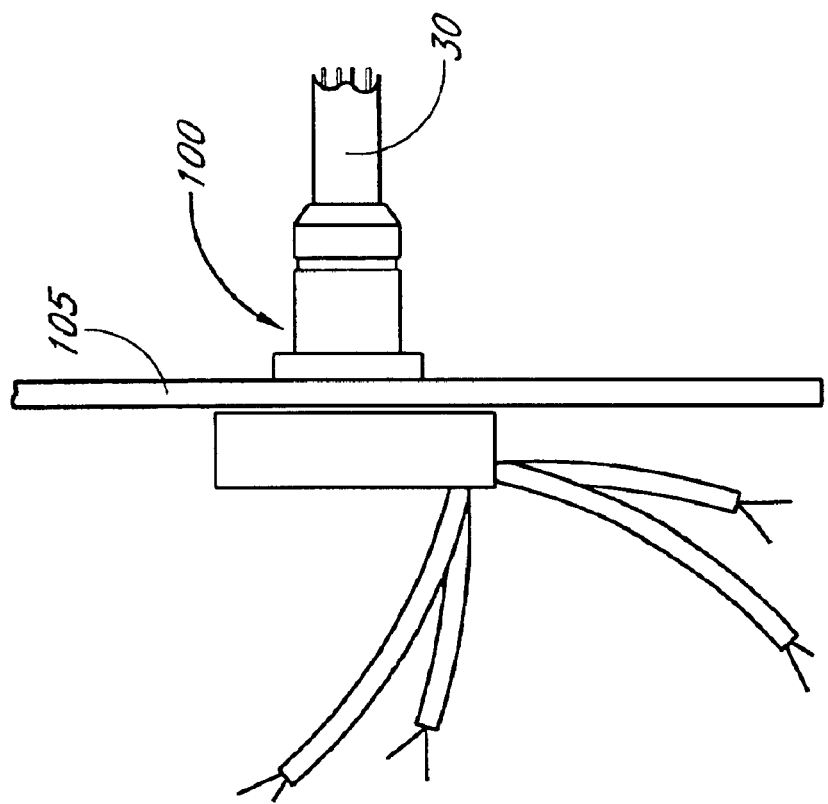
FIG. 9 is an elevational end view of another embodiment of the invention in which the Quadrax cable entry is bolted to a panel.

The embodiment shown in FIGS. 2 and 8 includes a connector having sections 35, 36. However, an embodiment of the invention can be also configured to attach directly to a panel with a header as shown in FIG. 9, wherein the Quadrax cable entry 100 is simply bolted to a panel 105.

Figure 10:
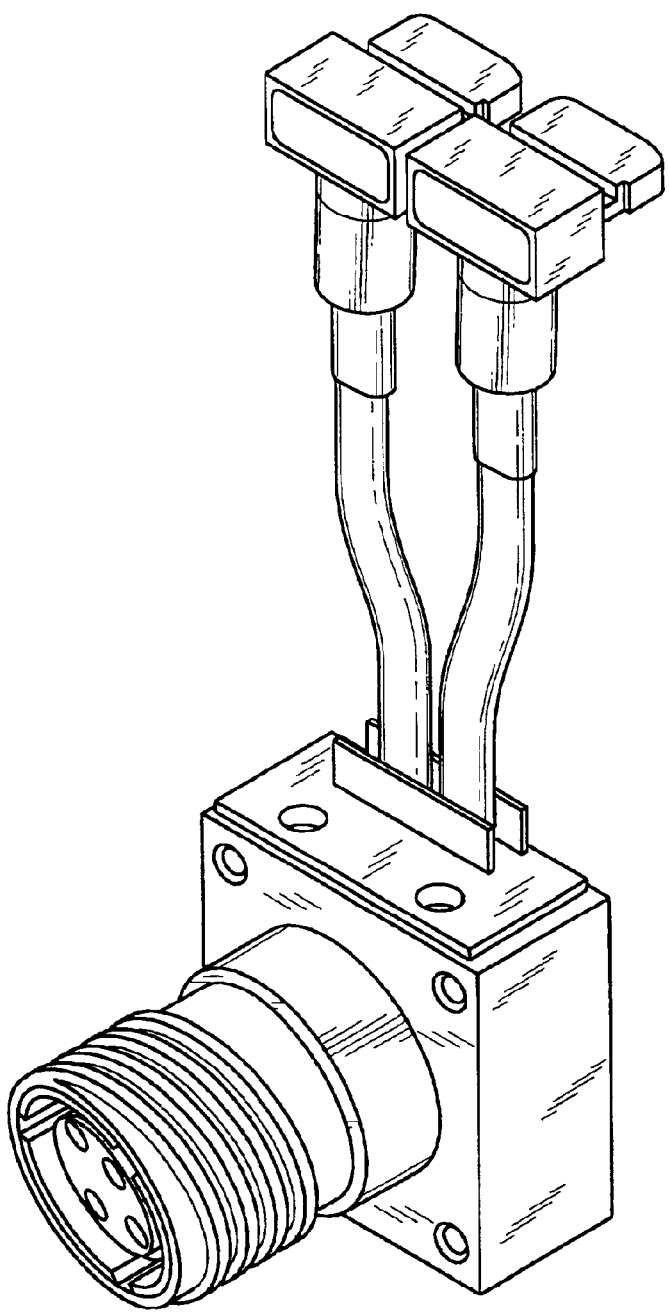
FIG. 10 is a perspective view of the Quadrax to Twinax connector including a connector for the Quadrax cable.
Figure 11:
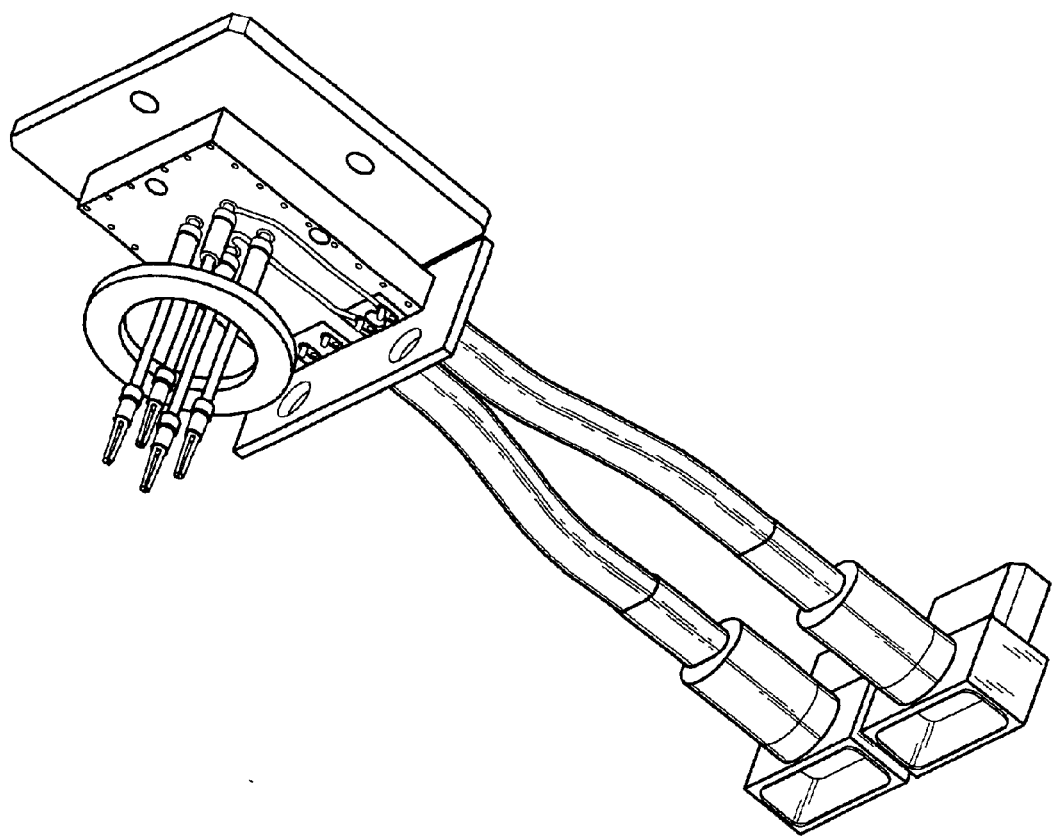
FIG. 11 is another perspective view of the apparatus of FIG. 10 with the connector body removed to illustrate the internal connector pins.

The 90° exit of the separate differential Twinax cables 25a and 25b shown in FIGS. 8, 10 and 11 are examples of the invention. In other embodiments, the cables 25a and 25b can exit at any convenient angle including straight out the back, as shown in FIG. 9.

Figure 12:
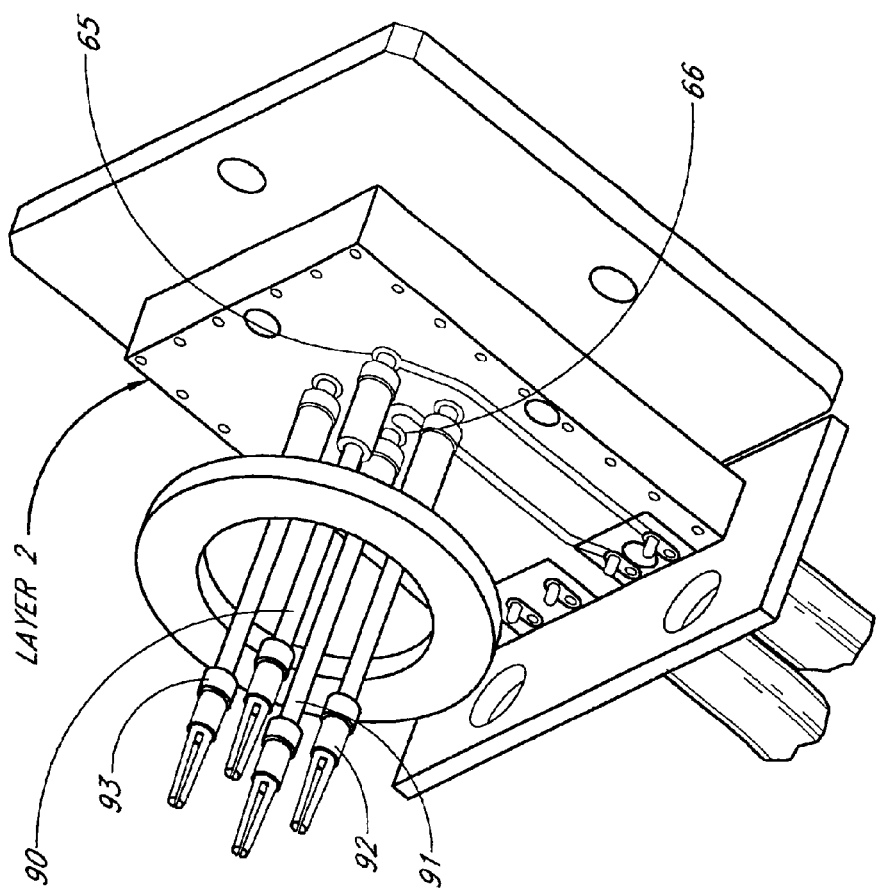
FIG. 12 is an enlarged view of the connector of FIGS. 10 and 11 with the layer 2 of FIGS. 5 and 6 exposed.

FIGS. 11 and 12 show the assembly of the connector of FIG. 10 with the connector shell removed exposing the stripline assembly.

The dimensions and material properties of the boards shown in FIGS. 5 and 6 are determined by the applicable well known equations. When the preferred conditions are achieved, the transmitted signal (source) is very efficiently delivered to its destination (load).

The equations for stripline are included in Appendix A(1) and A(2). The specifications for exemplary dielectric board 44 are provided by Appendix B. Manufacturing information of an exemplary embodiment are shown in Drawing No. 145-0097-000 (Appendices C1, C2 and C3).

Although this invention has been described in terms of certain preferred embodiments, other embodiments that are apparent to those of ordinary skill in the art, including embodiments which do not provide all of the benefits and features set forth herein, are also within the scope of this invention.

32 Coupled Lines $$C_f(a=\infty) = -\frac{2.0}{\pi}\left[\frac{1.0}{1.0+s}\log\left(\frac{1.0-s}{2.0}\right) + \frac{1.0}{1.0-s}\log\left(\frac{1.0+s}{2.0}\right)\right] \quad (4.6.3.21)$$

REFERENCES

[1] Howe, Jr., Harlan, *Stripline Circuit Design*, Artech House, Norwood, MA, 1974. (Has tables of data that can be used for checking results.)

[2] King, Charles A., "Math Software Simplifies Power Combiner Design," *Microwaves & RF*, June 1990, pp. 145-151.

[3] Knighten, James L., "Effect of Conductor Thickness on the Mode Capacitances of Shielded Strip Transmission Lines," *1978 IEEE MTT-S Symposium Digest*, pp. 416-418.

[4] Mosko, Joseph A., "Coupling Curves for Offset Parallel-Coupled Strip Transmission Lines," *Microwave Journal*, Vol. 10, No. 5, April 1967, pp. 35-37.

[5] Shelton, P.J., "Impedances and Offset Parallel Coupled Strip Transmission Line," *IEEE Transactions on Microwave Theory and Techniques*, Vol. MTT-14, No. 1, January 1966, pp. 7-15, and "Correction" *IEEE Transactions on Microwave Theory and Techniques*, MTT-14, No. 5, May 1966, p. 249. (Article gives synthesis equations.)

4.6.4 Zero-Thickness Edge-Coupled Stripline

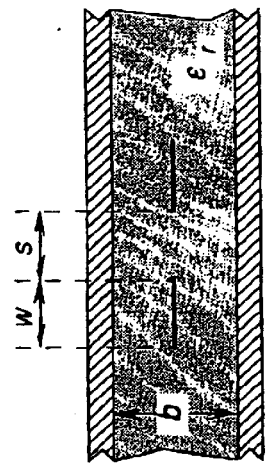

Figure 4.6.4.1: Edge-Coupled Stripline

APPENDIX A (3.1)F

233

$$Z_{0,e} = \frac{30\pi}{\sqrt{\epsilon_r}} \frac{K(k'_e)}{K(k_e)} \quad (\Omega) \quad (4.6.4.1)$$

$$Z_{0,o} = \frac{30\pi}{\sqrt{\epsilon_r}} \frac{K(k'_o)}{K(k_o)} \quad (\Omega) \quad (4.6.4.2)$$

$$k_e = \tanh\left(\frac{\pi w}{2b}\right)\tanh\left[\frac{\pi(w+s)}{2b}\right] \quad (4.6.4.3)$$

$$k_o = \tanh\left(\frac{\pi w}{2b}\right)\coth\left[\frac{\pi(w+s)}{2b}\right] \quad (4.6.4.4)$$

$$k'_e = \sqrt{1-k_e^2} \quad (4.6.4.5)$$

$$k'_o = \sqrt{1-k_o^2} \quad (4.6.4.6)$$

Equations are exact.

REFERENCES

[1] Cohn, Seymour B., "Shielded Coupled-Strip Strip Transmission Line," *IRE Transactions on Microwave Theory and Techniques*, Vol. MTT-3, No. 10, October 1955, pp. 29-38. (This reference is a seminal article giving all the necessary information for design of striplines and edge-coupled striplines.)

[2] Howard, John, and Wenny C-Lin, "Simple Rules Guide Design of Wideband Stripline Couplers," *Microwaves & RF*, May 1988, pp. 207-211.

[3] Matthaei, G., L. Young, and E.M.T. Jones, *Microwave Filters, Impedance-Matching Networks, and Coupling Structures*, Artech House, Norwood, MA 1980. (Typo in Eqn 5.05-2 corrected here.)

APPENDIX A(2)

234 *Coupled Lines*

4.6.5 Finite-Thickness Edge-Coupled Striplines

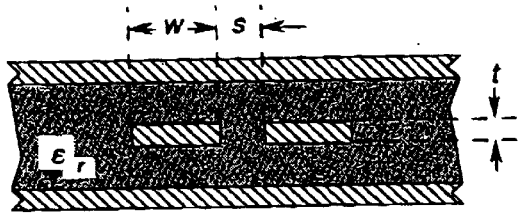

Figure 4.6.5.1: Edge-Coupled Stripline

The equations of Cohn [2] are $$Z_{0,e}\left(\frac{w}{b}, \frac{t}{b}, \frac{s}{b}\right) = \left\{\frac{1.0}{Z_0\left(\frac{w}{b}, \frac{t}{b}\right)} - \frac{C_f'(t/b)}{C_f'(0)}\left[\frac{1.0}{Z_0\left(\frac{w}{b}, 0\right)} - \frac{1.0}{Z_{0,e}\left(\frac{w}{b}, 0, \frac{s}{b}\right)}\right]\right\}^{-1} \quad (\Omega)$$
(4.6.5)

for $s/t \geq 5.0$ $$Z_{0,o}\left(\frac{w}{b}, \frac{t}{b}, \frac{s}{b}\right) = \left\{\frac{1.0}{Z_0\left(\frac{w}{b}, \frac{t}{b}\right)} - \frac{C_f'(t/b)}{C_f'(0)}\left[\frac{1.0}{Z_{0,o}\left(\frac{w}{b}, 0, \frac{s}{b}\right)} - \frac{1.0}{Z_0\left(\frac{w}{b}, 0\right)}\right]\right\}^{-1} \quad (\Omega)$$
(4.6.5)

and for $s/t \leq 5.0$ $$Z_{0,o}\left(\frac{w}{b}, \frac{t}{b}, \frac{s}{b}\right) = \left\{\overline{Z_{0,o}(}\right.$$

$$+ \overline{Z_{0,o}}$$

$$- \frac{2.0}{377}$$

where $Z_0\left(\frac{w}{b}, \frac{t}{b}\right)$ = finite-thickness $Z_0\left(\frac{w}{b}, 0\right)$ = zero-thickness $Z_{0,e}\left(\frac{w}{b}, 0, \frac{s}{b}\right)$ = zero-th
(see S $Z_{0,o}\left(\frac{w}{b}, 0, \frac{s}{b}\right)$ = zero-t
(see S $$C_f'(t/b) = \frac{0.0885\,\varepsilon_r}{\pi}\left\{1.0\right.$$

$$- \left(\frac{1.0}{1.0 - t/b}\right.$$

†[1]

APENDIX B, PAGE 1

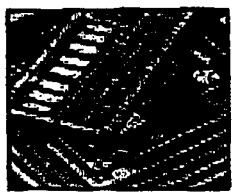

Rogers Corporation
Microwave Materials Division
100 S. Roosevelt Avenue
Chandler, AZ 85226 U.S.A.
Tel: 480 961-1382
Fax: 480 961-4533
Website: http://www.rogers-corp.com/mwu/
litmwu@rogers-corp.com High Frequency
Circuit Materials

DATA
RT1.5870

RT/duroid® 5870
Glass Microfiber Reinforced Polytetrafluoroethylene Composite RT/duroid® 5870 glass microfiber reinforced PTFE composite is designed for exacting stripline and microstrip circuit applications.

Glass reinforcing microfibers are randomly oriented to maximize benefits of fiber reinforcement in the directions most valuable to circuit producers and in the final circuit application.

The dielectric constant of RT/duroid 5870 laminates is uniform from panel to panel and is constant over a wide frequency range. Its low dissipation factor extends the usefulness of RT/duroid 5870 to X-band and above.

RT/duroid 5870 laminate is easily cut, sheared and machined to shape. It has excellent dimensional stability and is resistant to all solvents and reagents hot or cold, normally used in etching printed circuits or in plating edges and holes.

Normally supplied as a laminate with electrodeposited copper of 1/4 to 2 ounces/ft.² on both sides, RT/duroid 5870 composites can also be clad with rolled copper foil for more critical electrical applications. Cladding with aluminum, copper and brass plate may also be specified.

When ordering RT/duroid 5870 laminates, it is important to specify dielectric thickness, tolerance, rolled or electrodeposited copper foil and weight of copper foil required.

(See reverse for product data)

ROGERS
SINCE 1832

APPENDIX B, PAGE 2

RT/duroid 5870 Properties:

| PROPERTY | TYPICAL VALUE | | | DIRECTION | UNITS | CONDITION | TEST METHOD |
|---|---|---|---|---|---|---|---|
| Dielectric Constant, $\epsilon_r$ | 2.35 | | | Z | — | C24/23/50 | 1 MHz IPC-TM-650 2.5.5.3 |
| | 2.33– 0.02 spec. | | | Z | | C24/23/50 | 10 GHz IPC-TM-650 2.5.5.5 |
| Dissipation Factor, tan δ | 0.0005 | | | Z | — | C24/23/50 | 1 MHz IPC-TM-650 2.5.5.3 |
| | 0.0012 | | | Z | | C24/23/50 | 10 GHz IPC-TM-650 2.5.5.5 |
| Volume Resistivity | 2 X 10⁷ | | | Z | Mohm cm | C93/35/90 | ASTM D257 |
| Surface Resistivity | 3 X 10⁸ | | | Z | Mohm | C93/35/90 | ASTM D257 |
| Tensile Modulus | Test at 23 C | Test at 100 C | | X | MPa (kpsi) | A | ASTM D638 |
| | 1300 (189) | 490 (71) | | Y | | | |
| | 1280 (185) | 430 (63) | | | | | |
| ultimate stress | 50 (7.3) | 34 (4.8) | | X | MPa (kpsi) | | |
| | 42 (6.1) | 34 (4.8) | | Y | | | |
| ultimate strain | 9.8 | 8.7 | | X | % | | |
| | 9.8 | 8.6 | | Y | | | |
| Compressive Modulus | 1210 (176) | 680 (99) | | X | MPa (kpsi) | A | ASTM D695 |
| | 1360 (198) | 860 (125) | | Y | | | |
| | 803 (120) | 520 (76) | | Z | | | |
| ultimate stress | 30 (4.4) | 23 (3.4) | | X | MPa (kpsi) | | |
| | 37 (5.3) | 25 (3.7) | | Y | | | |
| | 54 (7.8) | 37 (5.3) | | Z | | | |
| ultimate strain | 4.0 | 4.3 | | X | % | | |
| | 3.3 | 3.3 | | Y | | | |
| | 8.7 | 8.5 | | Z | | | |
| Water Absorption Thickness = 0.8 mm (0.031) Thickness = 1.5 mm (0.062) | 0.9 (0.02) 13 (0.015) | | | | mg (%) | D24/23 | ASTM D570 |
| Specific Gravity | 2.2 | | | | | | ASTM D792 |
| Heat Distortion Temperature | >260 (>500) | | | X,Y | C (F) | 1.82 MPa (264 psi) | ASTM D648 |
| Specific Heat | 0.96 (0.23) | | | | J/g/K (BTU/lb/ F) | | Calculated |
| Thermal Conductivity | 0.22 | | | Z | W/m/K | | ASTM C518 |
| Thermal Expansion | X | Y | Z | <<< | mm/m | | ASTM D3386 (10K/min) (Values given are total change from a base temperature of 35 C.) |
| | -5.0 | -5.5 | -11.6 | | | -100 C | |
| | -0.6 | -0.9 | -4.0 | | | 15 | |
| | -0.3 | -0.4 | -2.6 | | | 25 | |
| | 0.7 | 0.9 | 7.5 | | | 75 | |
| | 1.8 | 2.2 | 22.0 | | | 150 | |
| | 3.4 | 4.0 | 58.9 | | | 250 | |

[1] SI units first with other frequently used units in Parentheses.
[2] References: Internal TR's 1430, 2224, 2856. Tests were at 23°C unless otherwise noted. Typical values should not be used for specification limits.

RT/duroid® and DUROID® are licensed trademarks of ROGERS Corporation for its microwave laminates.

The above data represents typical values, not statistical minimums. It is not intended to and does not create any warranties, express or implied, including any warranty of merchantability or fitness for a particular purpose. The relative merits of materials for a specific application should be determined by your evaluation.

These products may require a validated export license issued by the United States Department of Commerce for export of these materials from the United States or Canada.

ROGERS
SINCE 1832

Rogers Corporation
Microwave Materials Division
100 S. Roosevelt Avenue
Chandler, AZ 85226-3415 U.S.A.
Tel: 480 961-1382
Fax: 480 961-4533
Toll Free: 877 643-7701
Website: http:\\www.rogers-corp.com/mwu/
ISO 9002 CERTIFIED ©1991, 1994, 1995, 1999     Printed in U.S.A.     Revised 2/99 2258-029-10.0-CN APPENDIX C1
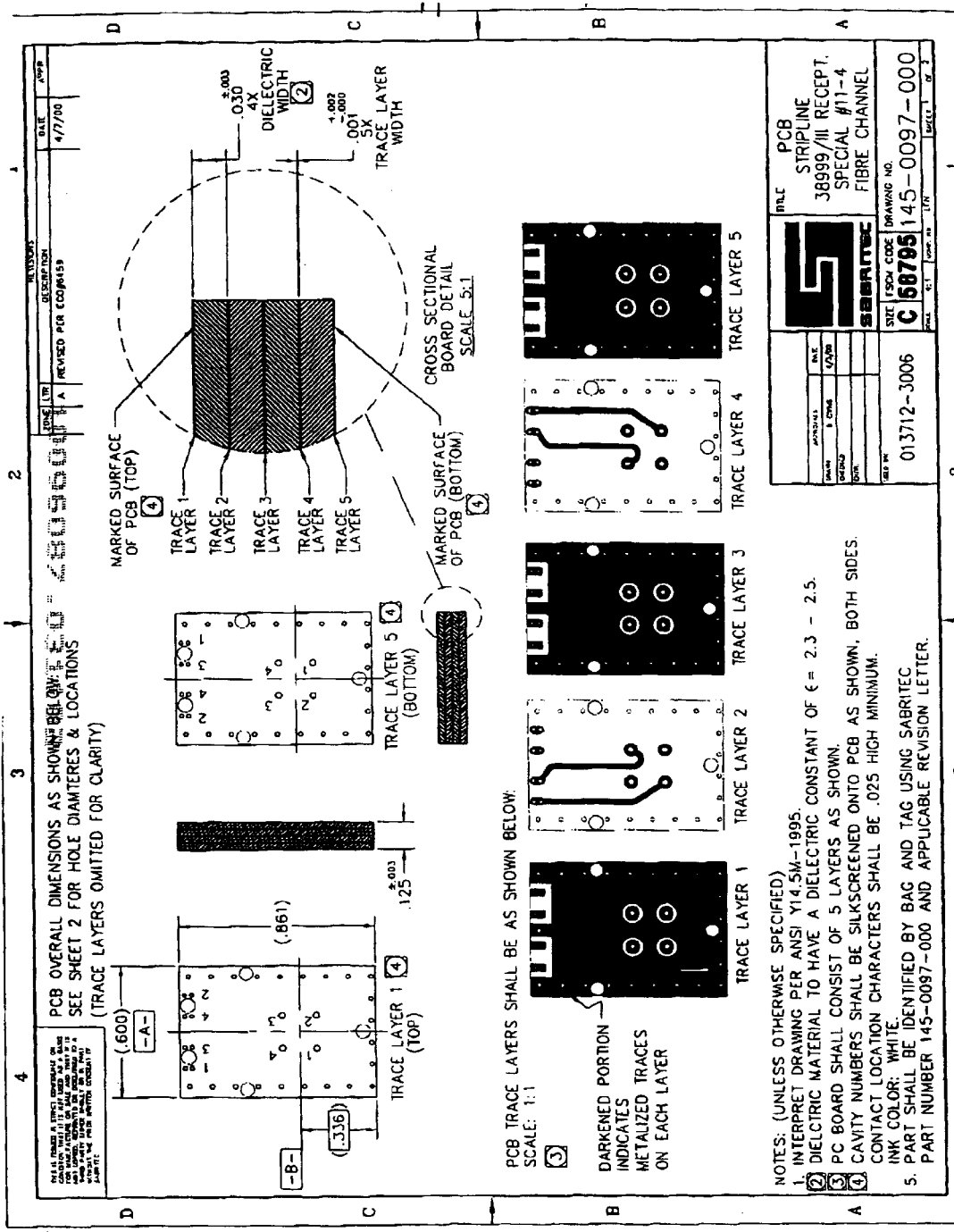

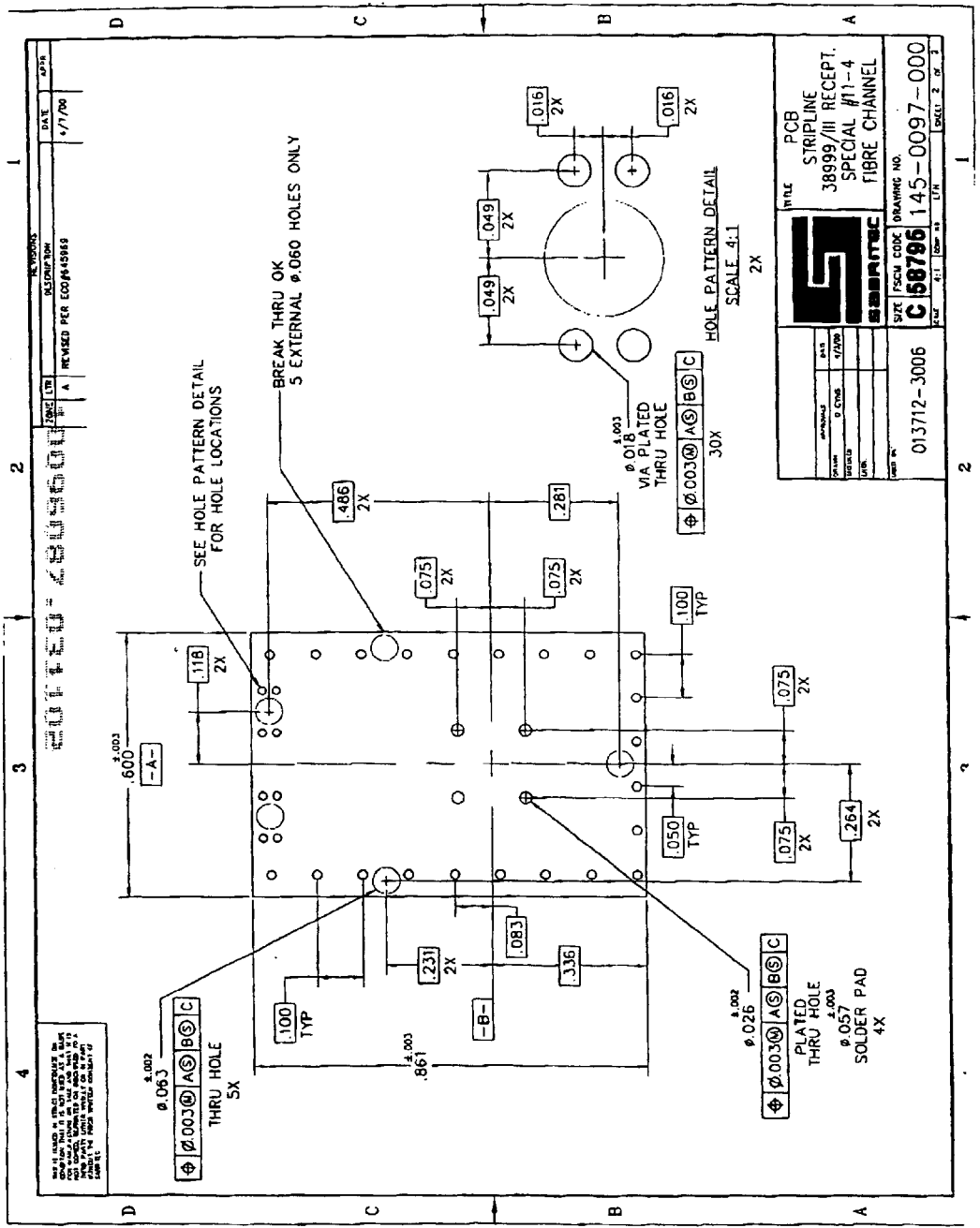

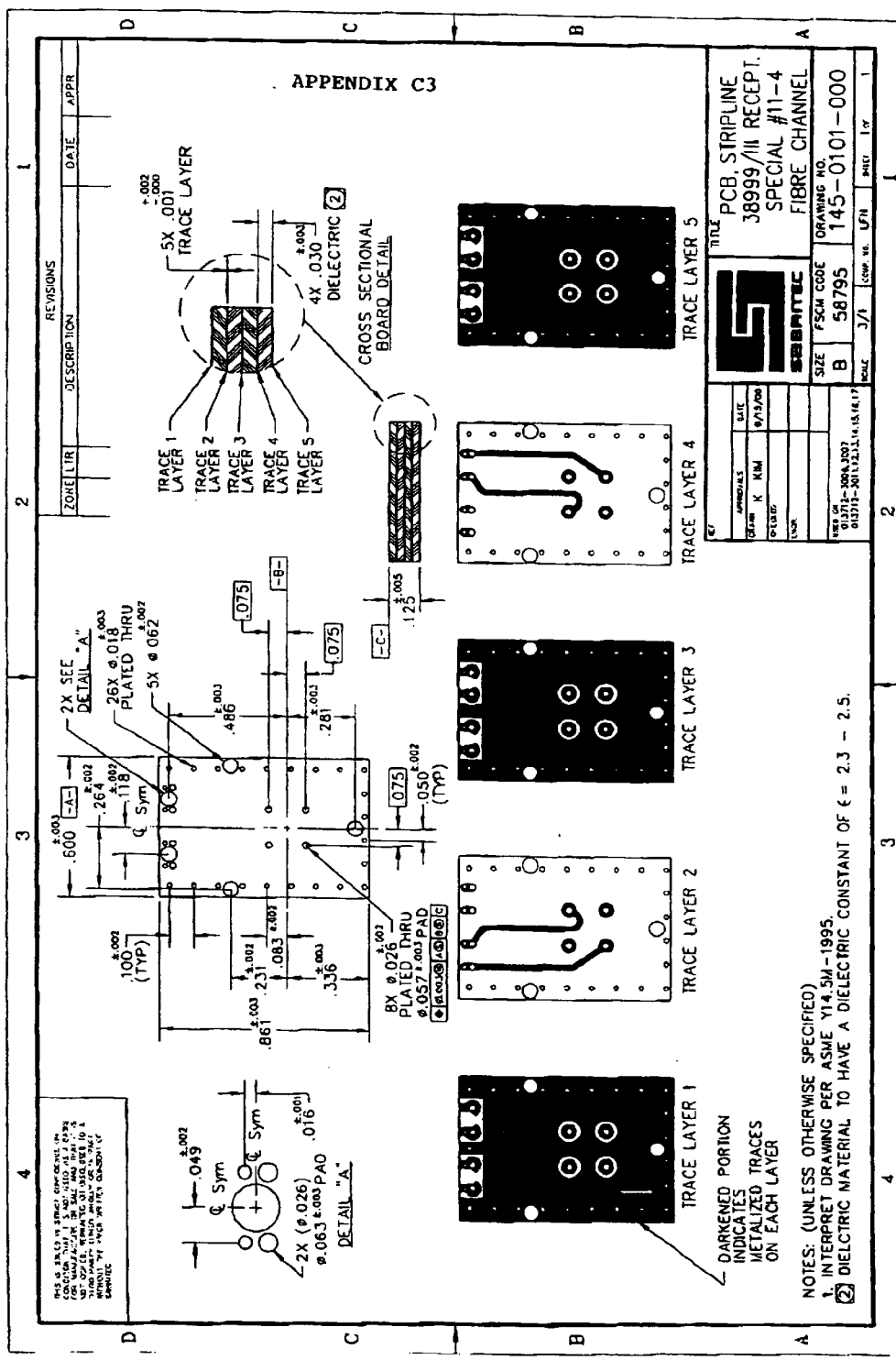

What is claimed is:

1. A conversion apparatus for connecting from a first high speed data cable having two orthogonal pairs of conductors to second and third high speed data cables each having a single pair of conductors comprising:

two or more stacked dielectric boards supporting electrical traces;

a ground plane between said stacked boards;

plated through holes in said boards respectively in contact with said traces;

first conductors connected to plated through holes on one of said boards;

second conductors connected to plated through holes on another of said boards;

electrical connections between said first conductors and one of said two orthogonal pairs of said first high speed data cable;

electrical connections between said second conductors and the other of said two orthogonal pairs of said first high speed data cable;

electrical connections between said traces on one of said dielectric boards and the conductor pair of said second high speed data cable; and electrical connections between said traces on another of said dielectric boards and the conductor pair of said third high speed data cable.

2. The method of transference of high speed data between a Quadrax cable and first and second Twinax cable, comprising:

forming first traces ending in plated through holes on a first dielectric board;

forming second traces ending in plated through holes on a second dielectric board;

stacking said boards between ground planes;

connecting first conductors to said first traces on said first board through said through holes so that said first conductors do not electrically connect to said second traces on said second board;

connecting second conductors to said second traces on said second board through said through holes so that said second conductors do not electrically connect to said first traces on said first board;

attaching said first conductors connected to said first traces on said first dielectric board to a first orthogonal pair of the Quadrax cable;

attaching said second conductors connected to said second traces on said second dielectric board to a second orthogonal pair of the Quadrax cable;

connecting said first traces on said first dielectric board to said first Twinax cable; and connecting said second traces on said second dielectric board to said second Twinax cable.

3. A connector apparatus for connecting from four wire Quadrax cable to a pair of two wire Twinax cables comprising:

a multilevel stack having a first dielectric board;

first and second conductive metal strips attached to said first dielectric board;

a second dielectric board;

first and second conductive metal strips attached to said second dielectric board;

first and second ground planes located on opposite sides of said first dielectric board; and second and a third ground planes located on opposite sides of said second dielectric board, said ground planes isolating the conductive metal strips attached to said first dielectric board from the conductive strips attached to said second dielectric board;

two plated through hole openings in said stack connected to the conductive metal strips attached to said first dielectric board;

two plated through hole openings in said stack connected to the conductive strips attached to said second dielectric board;

the two conductors of one of said pair of Twinax cables respectively connected to the first and second conductive strips attached to said first dielectric board;

the two conductors of the other of said pair of Twinax cables respectively connected to the first and second conductive strips attached to said second dielectric board;

four electrically conductive pins located in said plated through holes;

said Quadrax cable having respective orthogonal pairs of conductors, one of said diagonal pairs connected to the two of said conductive pins in plated through holes electrically connected to the conductive strips attached to said first dielectric board and the other of said diagonal pairs of said Quadrax cable connected to the two of said conductive pins in the plated through holes electrically connected to the conductive strips attached to said second dielectric board so that the orthogonal pairs of said Quadrax cable are respectively connected to said pair of two wire Twinax cables without disturbing the relative positions of said orthogonal conductors.

* * * * *

UNITED STATES PATENT AND TRADEMARK OFFICE
CERTIFICATE OF CORRECTION

PATENT NO. : 6,794,578 B2  Page 1 of 1
APPLICATION NO. : 10/096087
DATED : September 21, 2004
INVENTOR(S) : Salvatore Brancaleone It is certified that error appears in the above-identified patent and that said Letters Patent is hereby corrected as shown below:

At column 3, line 10 (Approx.), please delete "maybe" and insert -- may be --, therefor.
At column 4, line 12, delete "ran" and insert -- run --, therefor.
At column 20, line 8, in Claim 3, delete "multilevel" and insert -- multi-level --, therefor.

Signed and Sealed this

Nineteenth Day of February, 2008

JON W. DUDAS
*Director of the United States Patent and Trademark Office*